United States Patent [19]

Boyko et al.

[11] Patent Number: 5,472,735
[45] Date of Patent: Dec. 5, 1995

[54] METHOD FOR FORMING ELECTRICAL CONNECTION TO THE INNER LAYERS OF A MULTILAYER CIRCUIT BOARD

[75] Inventors: Christina M. Boyko, Conklin; Richard W. Carpenter, Johnson City; Raymond T. Galasco, Vestal; Krystyna W. Semkow, Poughquag; Herbert Wegener, Endwell, all of N.Y.

[73] Assignee: International Business Machines Corporation, Armonk, N.Y.

[21] Appl. No.: 351,819

[22] Filed: Dec. 8, 1994

Related U.S. Application Data

[62] Division of Ser. No. 143,819, Oct. 27, 1993, Pat. No. 5,374,338.

[51] Int. Cl.$^6$ .............................. B05D 5/12; C25D 5/34; C25F 3/14
[52] U.S. Cl. ........................... 427/97; 427/98; 205/126; 204/129.35; 204/129.75; 204/DIG. 7
[58] Field of Search ................. 205/126; 204/129.75, 204/129.1, 129.35, 920, DIG. 7; 427/97, 98

[56] References Cited

U.S. PATENT DOCUMENTS

| | | | |
|---|---|---|---|
| 3,562,040 | 2/1971 | Garies | 156/664 |
| 3,701,698 | 10/1972 | Forestek | 156/664 |
| 3,742,597 | 7/1973 | Davis | 205/126 |
| 3,785,945 | 1/1974 | MacArthur | 204/129.95 |
| 3,873,429 | 3/1975 | Brown | 205/126 |
| 4,022,619 | 5/1977 | Pagliaro et al. | 430/331 |
| 4,078,980 | 3/1978 | Harris et al. | 204/129.3 |
| 4,135,988 | 1/1979 | Dugan et al. | 205/126 |
| 4,217,182 | 8/1980 | Cross | 427/98 X |
| 4,303,482 | 12/1981 | Bühne et al. | 204/129.3 |
| 4,391,841 | 7/1983 | Zeblisky | 427/98 X |
| 4,425,380 | 1/1984 | Nuzzi et al. | 427/97 |
| 4,521,262 | 6/1985 | Pellegrino | 205/126 X |
| 4,588,471 | 5/1986 | Griffith et al. | 156/652 |
| 4,765,865 | 8/1988 | Gealer et al. | 204/129.65 |
| 4,783,237 | 11/1988 | Aine et al. | 437/15 |
| 5,167,778 | 12/1992 | Kaneko et al. | 204/129.3 |
| 5,252,195 | 10/1993 | Kobayashi et al. | 205/126 |
| 5,374,338 | 12/1994 | Boyko et al. | 204/129.1 |

FOREIGN PATENT DOCUMENTS 0018556  4/1980  European Pat. Off. .

*Primary Examiner*—Donald R. Valentine
*Attorney, Agent, or Firm*—Calfee, Halter & Griswold

[57] ABSTRACT

The present invention relates to a method for selectively electroetching a metal from an electrical device having the steps of: immersing the electrical device in an etching solution; immersing a cathode in the etching solution; applying an etching potential to a preselected area of the metal; and maintaining a passivation potential at the metal to remain unetched. The metal to remain unetched is not electrically connected to the preselected area and the passivation potential does not equal the etching potential.

The present invention further relates to a method of forming an electrical connection to the inner layers of a multilayer circuit board having a copper foil surface layer and copper containing inner layers.

6 Claims, 2 Drawing Sheets

METHOD FOR FORMING ELECTRICAL CONNECTION TO THE INNER LAYERS OF A MULTILAYER CIRCUIT BOARD

This is a divisional of application Ser. No. 08/143,819, filed on Oct. 27, 1993, which issued as U.S. Pat. No. 5,374,338 on Dec. 20, 1994.

FIELD OF THE INVENTION

The present invention relates generally to a method of selectively etching a metal from the surface of an electronic device, and more particularly to a method of selectively electroetching a metal, without the use of a mask, by maintaining the metal to be etched at an etching potential while maintaining the metal to remain at a different, or passivating potential.

BACKGROUND OF THE INVENTION

Various methods are known for the selective electrochemical etching of metals. According to these methods, the workpiece whose surface is to be etched is generally made the anode and contacted with the electrolyte into which the cathode is immersed. A surface can be selectively etched by limiting the contact of the electrolyte to only those areas of the surface that are to be etched. This can be achieved by covering the surface areas which are not to be etched with a suitable masking material, or by limiting the electrolyte contact to only the surface areas to be etched.

In multilayer circuit board fabrication, a copper foil is laminated onto a dielectric layer, which is laminated onto an inner printed circuit layer. The copper foil is etched to produce a roughened surface. This roughened surface is then protected from subsequent processing steps by applying an adhesive tape, such as polyester tape, over the copper layer. In order to make electrical connection to the inner layers, holes are drilled through the multiple layers and then cleaned chemically and/or mechanically. The adhesive tape is then removed from the roughened copper surface. It is often necessary to remove the adhesive of the tape from the copper surface by using halogenated hydrocarbon solvents. Once the tape and adhesive are removed, the surface of the multilayer circuit and the through holes are electrolessly plated to form an electrical contact to the inner layers.

With the method of the present invention, it is possible to first drill the through holes in the multilayer circuit board, and then etch the surface of the copper foil layer without etching or damaging the copper of the inner layers which is exposed to the etching solution in the through holes. There is no need, therefore, to use polyester tape to protect the copper foil since the copper foil is etched after the through holes have been drilled.

It is an object of the present invention to eliminate the need to use polyester tape in the fabrication of multilayer circuit boards to reduce the steps required, and therefore, the cost of producing multilayer circuit boards. In addition, because the use of polyester tape masking has significant environmental disadvantages due to the halogenated solvents required for tape adhesive removal, it is a further object to eliminate the use of halogenated solvents.

SUMMARY OF THE INVENTION

The present invention relates to a method for selectively electroetching a metal from an electrical device comprising the steps of: (a) immersing the electrical device in an etching solution; (b) immersing a cathode in the etching solution; (c) applying an etching potential to a preselected area of the metal; and (d) maintaining a passivation potential at the metal to remain unetched, wherein the metal to remain unetched is not electrically connected to the preselected area, and wherein the passivation potential does not equal the etching potential.

The present invention further relates to a method for forming an electrical connection to the inner layers of a multilayer circuit board having a copper foil surface layer and copper containing inner layers comprising the steps of: (a) forming at least one through hole or blind hole in the multilayer circuit board; (b) cleaning the through hole or blind hole; (c) selectively etching the surface of the copper foil layer by immersing the multilayer circuit board and a cathode in an etching solution of either sulfuric acid or nitric acid free of nitrous acid, and then applying an etching potential to the copper foil surface, while maintaining a passivation potential not equal to the etching potential at the copper containing inner layers; and (d) electrolessly depositing a conductive metal onto the surface where the copper foil was etched and onto the surface of the through hole or blind hole.

DETAILED DESCRIPTION OF THE INVENTION

The method of the present invention is based on the ability of certain chemical solutions to passivate a given metal at one potential ($E_1$), while actively etching the metal at a second potential ($E_2$). For selectively etching a metal surface, the electronic component containing the metal to be etched is immersed in a solution with potential $E_1$, the passivation potential, at the solution-metal interface. The specific metal surface to be etched is then biased at potential $E_2$, the etching potential, and etching occurs at this surface only. All other metal surfaces which are immersed in the solution and are not electrically connected to the metal to be etched, remain at potential $E_1$ and are not etched.

When copper is the metal to be etched, the electronic component is immersed in a sulfuric acid ($H_2SO_4$) or nitric acid ($HNO_3$) solution. These solutions, in the proper concentrations, and without nitrous acid in the nitric acid, do not chemically etch copper to a significant degree. It is believed that upon immersion into these solutions, $Cu_2O$ is formed at the copper surface almost immediately, resulting in surface passivation and the termination of chemical etching. However, if the proper potential is applied to the copper surface, preferential etching of this copper surface will occur. It is further believed that the applied potential causes the formation of CuO at the copper surface. The CuO is then dissolved in the solution, thus exposing the underlying copper for continued etching.

A source of copper ions, for example copper sulfate when the etching solution is $H_2SO_4$, is preferably added to the etching solution to maintain a steady state during the etching process.

Other metals that can be selectively etched with the method of the present invention are iron, nickel or invar in concentrated NaCl. In addition, stainless steel can be selectively etched in phosphoric acid.

In the following examples, the test coupons were one inch square sections of a multilayer printed circuit panel with 0.5 oz surface copper foil and large diameter through holes with two inner planes per hole.

EXAMPLE 1A

Figure 1:
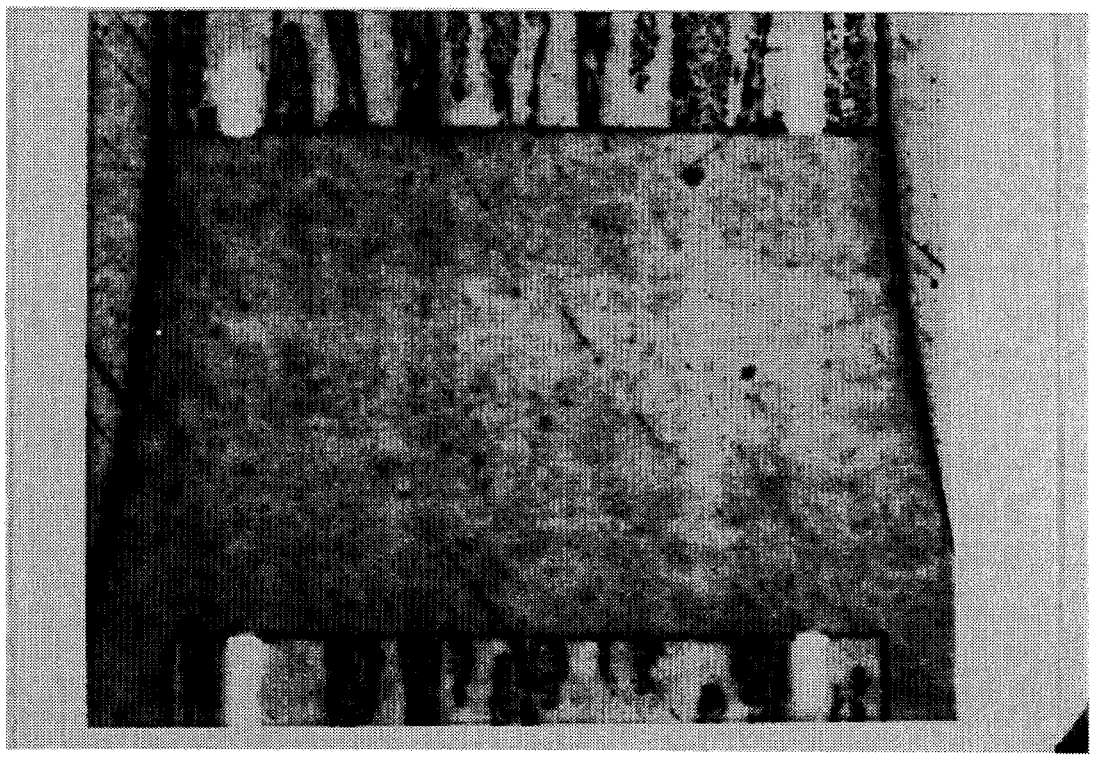
FIG. 1 is a photograph of a cross section of a panel with copper foil selectively electroetched in an $H_2SO_4$ solution by the method of the present invention.

A first coupon was electroetched in 20 vol. % $H_2SO_4$ with a potential of 0.2–0.5 Volt vs. SCE (saturated calomel electrode) applied to the surface copper foil only. The cathode was a small sheet of titanium. The coupon was agitated in the etching solution to allow solution flow into the through holes. Etching was terminated when no surface copper remained. (FIG. 1) A second control coupon was immersed in the solution without applying a potential to the coupon. No etching of the surface copper occurred.

EXAMPLE 1B

Figure 2:
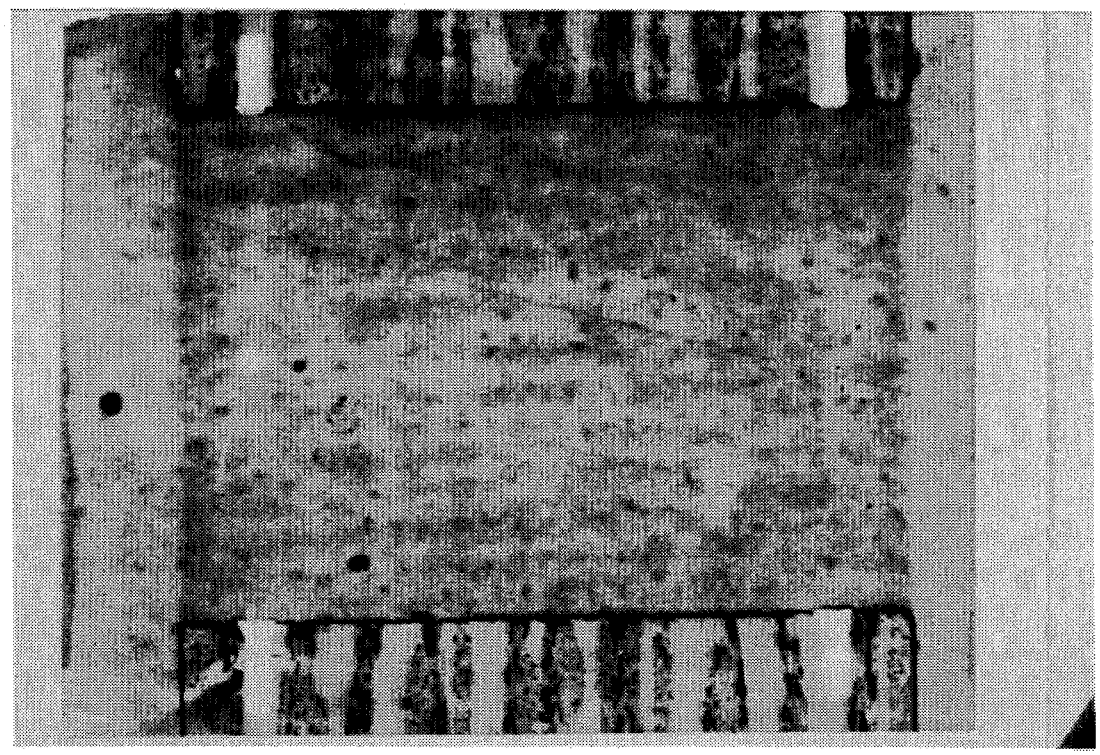
FIG. 2 is photograph of a cross section of a panel with copper foil selectively electroetched in an $HNO_3$ solution by the method of the present invention.

A coupon was electroetched in 20 vol. % $HNO_3$ with a potential of 0.5–2.0 volt vs SCE applied the surface copper foil only. (FIG. 2) Etching was terminated when no surface copper remained.

Five holes containing 20 inner plane connections were cross sectioned and measured for inner plane copper etchback for the coupons of both Example 1A and 1B. No measurable copper etchback was observed at any of the connections.

EXAMPLE 2A–2C

Three coupons were electroetched with a potential of 0.2–0.5 volt vs. SCE applied to the surface copper foil only. The cathode was a small sheet of titanium. Etching was terminated when no surface copper remained. The temperature of the etching solution was in the range 40°–60° C. The total etch time was 8–10 minutes. The coupon of Example 2A was electoetched in a 20 vol. % solution of $H_2SO_4$. The coupon of Example 2B was electroetched in a 30 vol. % solution of $H_2SO_4$. The coupon of Example 2C was electroetched in a 40 vol. % solution of $H_2SO_4$.

Five holes containing 20 inner plane connections were cross sectioned and measured for inner plane copper etchback for all three coupons. No measurable copper etchback was observed at any of the connections.

Figure 3:
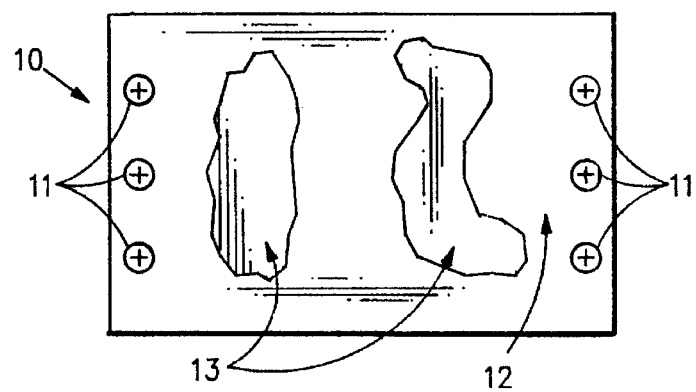
FIG. 3 is a diagram of an electroetched metal surface showing a nonuniform etching pattern.

When it is desired to electroetch a metal from a nonconductive substrate, the electrical contact to the metal, as well as the position of the electrode relative to the metal is important. The high current density in the region around the contact between the etched metal and the current/voltage input causes more rapid electroetching of the metal in this region than in the middle of the area to be etched. This nonuniform rate of etching can result in isolation of the unetched metal from the current/voltage source and termination of etching. FIG. 3 shows the surface of a metal coated panel 10 which has been etched by a method wherein electrical contact 11 to the metal surface has been made at the edges of the panel 10. The etched area 12 of the panel surrounds and has isolated the unetched metal areas 13 from the current/voltage source and therefore, these areas cannot be etched.

To compensate for the problem of nonuniform etching, sacrificial metal strips may be inserted between the metal to be etched and the electrical contact. The metal strips are preferably made of the same metal as the metal to be etched. The additional metal thickness allows for more uniform etching of the metal in the contact region as compared to the metal in the middle of the area to be etched.

A method of minimizing nonuniform etching, to be used concurrently with the addition of metal strips to the contact points, is to place the cathode close to the center of the metal to be etched. The area of the cathode is smaller than that of the coupon to be etched to reduce the high current density at the edges of the coupon. Uniform etching of the metal was achieved with the cathode configurations shown in FIGS. 4 and 5.

Figure 4:
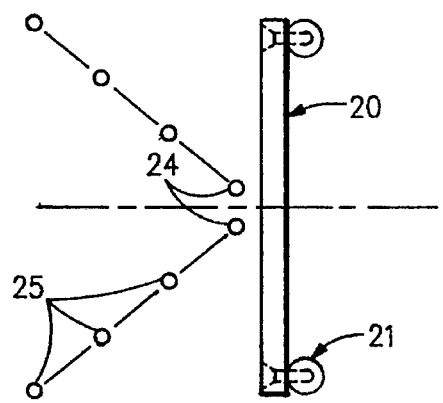
FIG. 4 is a diagram of the electrode placement in a pyramid configuration according to the present invention.
Figure 5:
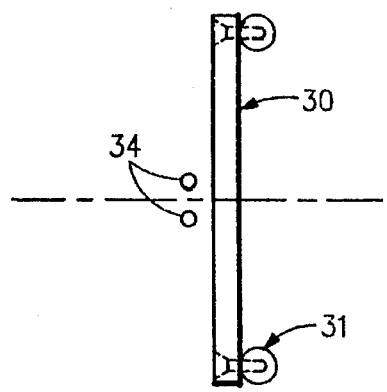
FIG. 5 is diagram of the electrode placement in a center configuration according to the present invention.

Specifically, FIG. 4 shows an electrode configuration in which a plurality of electrodes are placed in increasing distance from the plane of the metal surface to be etched. Two center electrodes 24 are positioned close to the center of the metal panel 20. On the side of each center electrode 24, in the direction away from the center are positioned 3 additional electrodes 25, evenly spaced and in increasing distance from the metal surface to be etched. Electrical contact 21 to the metal panel is made near the edge of the panel. FIG. 5 shows a simplified configuration in which 2 electrodes 34 are placed close to the center of the surface of the metal panel 30 to be etched. Electrical contact 31 to the metal panel is made near the edge of the panel.

EXAMPLE 3

Copper clad panels were electroetched by applying a voltage of 0.4–2.6 (current of 5–310 amps) to the panels. The potential of the panel relative to a piece of copper in the bath was 0.27–0.83 volts. The cathodes were 1.5 inch diameter titanium tubes, 26 inches long and were positioned 0.25 inches from the plane of the panel and in the configuration shown in FIG. 5. The panel measured 24 inches by 28 inches and was positioned so that the plane of the panel was perpendicular to the surface of the bath. Sacrificial copper strips were placed between the panel to be etched and the electrical contact to the panel.

The composition of the bath was 14–15 vol. % $H_2SO_4$ and 0.2M copper sulfate. During the electroetch process the temperature of the bath was in the range of 64°–73° C. When etching was complete, no isolated islands of copper remained on the surface of the panel.

When it is desired to electroetch the exterior of a multilayer panel, the interior metal planes will not be etched if they are not in electrical contact to the metal surface of the panel.

The invention is not limited to the embodiment which has just been described and it is intended by the following claims to include all technically equivalent means which come within the full scope and true spirit of the invention.

We claim:

1. A method for forming electrical connection to the inner layers of a multilayer circuit board having a copper foil surface layer and copper containing inner layers comprising the steps of:

(a) forming at least one through hole or blind hole in the multilayer circuit board;

(b) cleaning said through hole or blind hole;
(c) selectively etching the surface of the copper foil layer by a method comprising the steps of:
   (1) immersing the multilayer circuit board in an etching solution selected from the group consisting of a sulfuric acid solution and a nitric acid solution;
   (2) immersing a cathode in said etching solution, said cathode comprising at least one electrode;
   (3) applying an etching potential to the copper foil surface to etch said copper foil; and
   (4) maintaining a passivation potential at the copper containing inner layers, wherein said passivation potential does not equal said etching potential;
(d) electrolessly depositing a conductive metal onto the surface where the copper foil was etched and onto the surface of said through hole or blind hole to form an electrical connection to the copper containing inner layers.

2. The method claim 1 wherein copper sulfate is added to said etching solution.

3. The method of claim 2, wherein said etching potential is within the range 0.2–2.0 volts vs. SCE.

4. The method of claim 1 wherein said cathode is positioned in close proximity to the center of said copper foil surface.

5. The method of claim 4 further comprising placing sacrificial metal strips between the copper foil and the electrical contract to the copper foil.

6. The method of claim 1 wherein a plurality of cathodic electrodes are immersed in said etching solution and wherein said electrodes are arranged so that at least one center electrode is positioned in close proximity to the center of the surface of said copper foil and the remaining electrodes are spaced in increasing distance from the surface of said copper foil.

* * * * *